(12) United States Patent
Lu

(10) Patent No.: US 8,634,202 B2
(45) Date of Patent: Jan. 21, 2014

(54) POWER TRANSFORMING CIRCUIT BOARD

(75) Inventor: Shao-Feng Lu, Taoyuan County (TW)

(73) Assignees: FSP Technology Inc., Taoyuan County (TW); 3Y Power Technology (Taiwan), Inc., Taoyuan County (TW)

(*) Notice: Subject to any disclaimer, the term of this patent is extended or adjusted under 35 U.S.C. 154(b) by 548 days.

(21) Appl. No.: 12/728,281

(22) Filed: Mar. 22, 2010

(65) Prior Publication Data
US 2011/0226517 A1   Sep. 22, 2011

(51) Int. Cl.
H05K 1/11        (2006.01)
H05K 1/14        (2006.01)
H05K 1/02        (2006.01)

(52) U.S. Cl.
CPC .................................. H05K 1/0263 (2013.01)
USPC .......................................... 361/784; 361/792

(58) Field of Classification Search
CPC .................................................. H05K 1/0263
USPC .......... 361/748, 752, 760, 784, 792, 826, 827
See application file for complete search history.

(56) References Cited

U.S. PATENT DOCUMENTS

| | | | | |
|---|---|---|---|---|
| 6,649,836 | B2 * | 11/2003 | Brechbill et al. | 174/60 |
| 2004/0257762 | A1 * | 12/2004 | Shih | 361/687 |
| 2008/0030962 | A1 * | 2/2008 | Kunkle et al. | 361/726 |
| 2009/0161326 | A1 * | 6/2009 | Lin et al. | 361/752 |

FOREIGN PATENT DOCUMENTS

TW    200609714   *   3/2006
TW    I255982        6/2006

OTHER PUBLICATIONS

"Office Action of Taiwan counterpart application" issued on Aug. 29, 2012, p. 1-p. 5, in which the listed reference was cited.

* cited by examiner

*Primary Examiner* — Yuriy Semenenko
(74) *Attorney, Agent, or Firm* — Jianq Chyun IP Office

(57) ABSTRACT

A power transforming circuit board includes a substrate and at least one power output structure. The substrate has at least one power transforming circuit and at least one pair of power input holes. The power output structure is disposed on the substrate. Each power output structure is electrically connected with one corresponding power transforming circuit. Each power output structure has at least one cable connecting hole. The normal direction of each power output structure is oriented at an angle with respect to the normal direction of the substrate.

9 Claims, 3 Drawing Sheets

POWER TRANSFORMING CIRCUIT BOARD

BACKGROUND OF THE INVENTION

1. Field of the Invention

The present invention relates to a circuit board, and more particularly, to a power transforming circuit board.

2. Description of Related Art

Power supplies have been a key power transforming component for electronic devices all the time. With continuous development in electronics technology, internet and multimedia technologies are also becoming gradually grown-up. Therefore, power supplies with steady power output are desirable. In view of the fact that designing high-power power supplies involves high design cost and high-level technology, multilayer power supplies have been developed with the multiple layers arranged in a stack or side by side in parallel. The multilayer power supplies can be categorized into parallel power supplies with high power output and redundant power supplies.

FIG. 1 illustrates a circuit board for electrical connection with conventional multilayer power supplies. Referring to FIG. 1, the circuit board 10 includes multiple groups of power connecting ports 11a, 11b for electrical connection with multiple power supplies (not shown). Each group of power connecting ports 11a, 11b are electrically connected with power processing circuit 12a, 12b, and a heat dissipating hole 13 are defined between each group of power connecting ports 11a, 11b. In addition, a power transforming circuit 14 is disposed at a lower portion of the circuit board 10. The power processing circuits 12a, 12b are connected through power bridges 20 for power integration, and power cables 30 are assembled to power connecting holes 14a of the power transforming circuit 14. The power required by the electronic devices is becoming higher hand higher. However, the power output is limited by the industrial specifications that these electronic devices must comply with, for example, 2U or 3U server, where the 2U or 3U represents the industrial specification that follows the stand width of 19 inches and height of 1.75 inches. The power transforming circuit 14 must be disposed on the circuit board 10 and therefore the number of the power connecting ports 11a, 11b is limited, thus causing a waste of space. Moreover, to meet different power needs of various electronic devices, there must be a sufficient number of the power transforming circuits 14 disposed on the circuit board 10 and, accordingly, there must be a sufficient number of the power connecting holes 14a. As a result, the use area of the circuit board 10 and hence the overall size of the electronic devices cannot be effectively reduced.

SUMMARY OF THE INVENTION

Accordingly, the present invention is directed to a power transforming circuit board with an improved expandability.

The present invention provides a power transforming circuit board including a substrate and at least one power output structure. The substrate comprises at least one power transforming circuit and at least one pair of power input holes. The power output structure is disposed on the substrate, wherein each power output structure is electrically connected with one corresponding power transforming circuit. Each power output structure has at least one cable connecting hole. The normal direction of each power output structure is oriented at an angle with respect to the normal direction of the substrate.

According to one embodiment of the power transforming circuit board, the power output structures do not all output the same power.

According to one embodiment of the power transforming circuit board, the power transforming circuit board further comprises at least one power cable inserted into the cable holes of the power output structures, respectively.

According to one embodiment of the power transforming circuit board, the power transforming circuit board further comprises a power input structure disposed on the substrate and inserted into the pair of power input holes. The power input structure has a fastening hole. In addition, the power input structure further includes at least one cable connecting hole positioned adjacent the fastening hole. The power input structure and the at least one power output structure are disposed on the same surface or opposite surfaces of the substrate.

According to one embodiment of the power transforming circuit board, the angle included between the normal direction of each power output structure and the normal direction of the substrate is within the range from 0 to 180 degrees.

In view of the foregoing, the entire area of the power transforming circuit board can be reduced. The power output structure disposed on the substrate makes the power transforming circuit board expandable.

In order to make the aforementioned and other features and advantages of the present invention more comprehensible, embodiments accompanied with figures are described in detail below.

DESCRIPTION OF THE EMBODIMENTS

Figure 1:
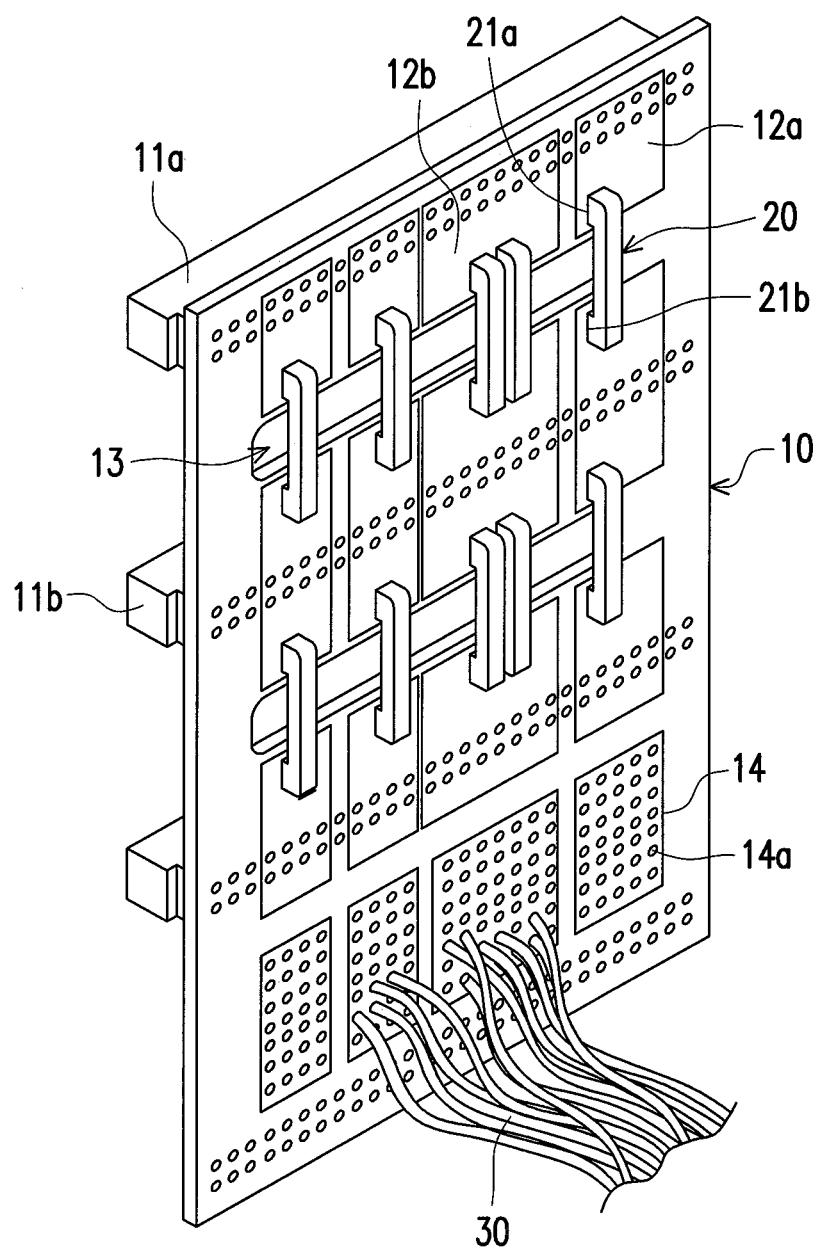
FIG. 1 illustrates a circuit board for electrical connection with conventional multilayer power supplies.
Figure 2:
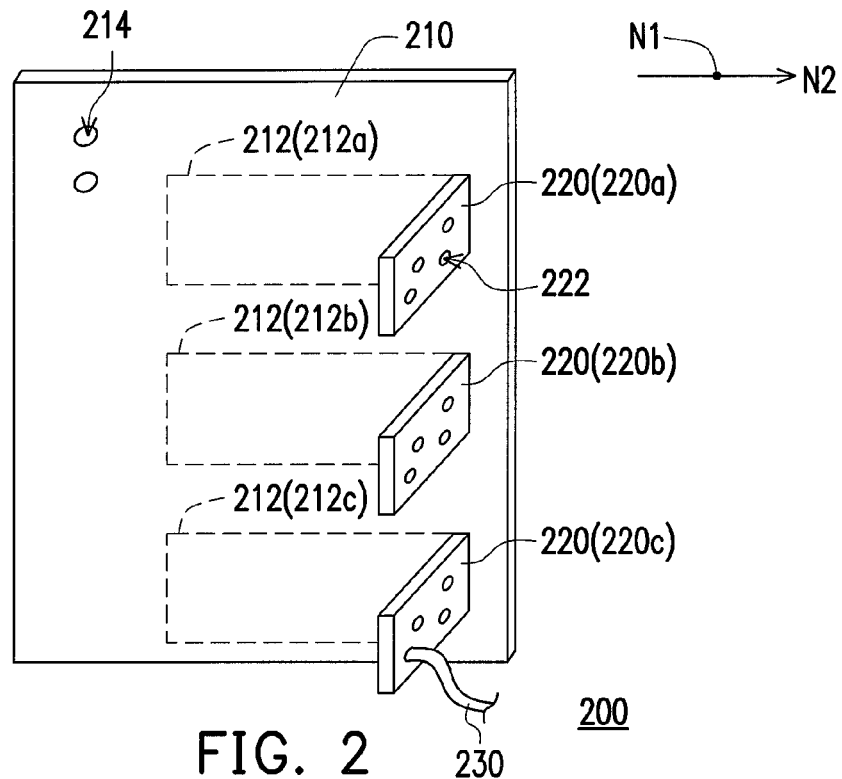
FIG. 2 illustrates a power transforming circuit board according to one embodiment of the present invention.

FIG. 2 illustrates a power transforming circuit board according to one embodiment of the present invention. Referring to FIG. 2, the power transforming circuit board 200 includes a substrate 210 and a plurality of power output structures 220. The substrate 210 includes at least one power transforming circuit 212 and at least one pair of power input holes 214. The power output structures 220 are disposed on the substrate 210. Each power output structure 220 is electrically connected with one corresponding power transforming circuit 212 and has at least one cable connecting hole 222. The normal direction N1 of each power output structure 220 is oriented at an angle with respect to the normal direction N2 of the substrate 210.

The number of the power input holes 214 can be any value as long as they are arranged in pairs. In addition, the power output structures 220 are steel rails that are assembled onto the substrate 210 or directly welded onto the substrate 210. The angle included between the normal direction N1 of the power output structure 220 and the normal direction N2 of the substrate 210 is within the range from 0 to 180 degrees, i.e., the power output structure 220 may be positioned perpendicularly to the substrate 210, or at an acute or obtuse angle with respect to the substrate 210, depending upon actual needs.

In addition, each power transforming circuit 212 may transform power inputted via the power input holes 214.

Therefore, the power output structures 220 electrically connected to respective power transforming circuits 212 do not all output the same power. For instance, assuming the power inputted via the power input holes 214 is, for example, 12V, because the power transforming circuit 212a does not transform the inputted power, the power output structure 220a electrically connected to the power transforming circuit 212a also outputs a 12V power. In addition, the power transforming circuit 212b transforms the inputted power such that the power output structure 220b electrically connected to the power transforming circuit 212b outputs, for example, a 5V power. Furthermore, the power transforming circuit 212c transforms the inputted power such that the power output structure 220c electrically connected to the power transforming circuit 212c outputs, for example, a 3.3V power. The above-mentioned values of the power outputted from the power output structures 220a, 220b, 220c are for the purposes of illustration only and should not be regarded as limiting. The number, position and power output capability of the power transforming circuit 212 and power output structures 220 could be changed based on actual requirements.

The power transforming circuit board 200 may further include at least one power cable 230. When multiple power cables 230 are used, the power cables 230 are inserted into the cable connecting holes 222 of the power output structures 220, respectively, such that the transformed or untransformed power can be outputted from the respective power output structures 220 via the power cables 230 to other electronic devices.

In the present embodiment, the substrate 210 of the power transforming circuit board 200 has the power output structures 220 and the cable connecting holes 222 of the power output structures 220 allows for insertion of the power cables 230 for power output. The cable connecting holes 222 are not directly disposed in the substrate 210, so that the area of the substrate 210 can be reduced and, therefore, the overall size of the electronic device equipped with the power transforming circuit board 200 can be effectively reduced. Moreover, the power transforming circuit board 200 has a different structure from the existing circuit board and can be custom-made.

Figure 3:
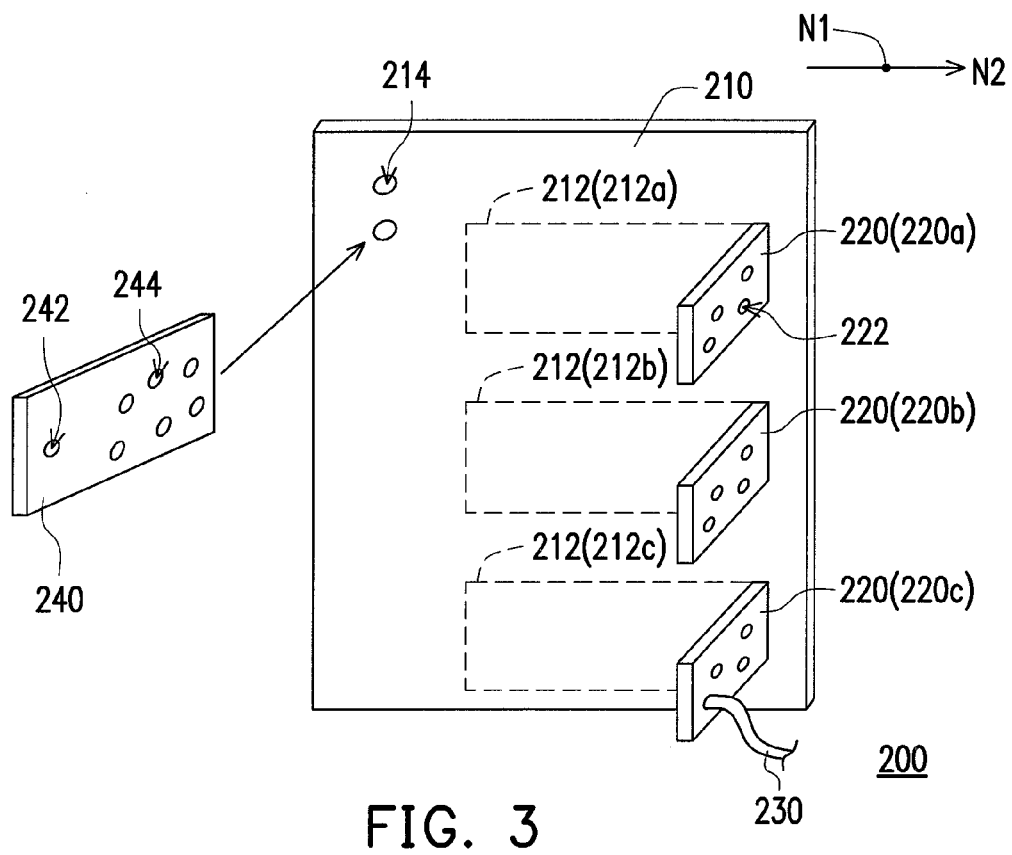
FIG. 3 illustrates a power transforming circuit board according to another embodiment of the present invention.

FIG. 3 illustrates a power transforming circuit board according to another embodiment of the present invention. Referring to FIG. 3, the power transforming circuit board 200 may further include a power input structure 240 disposed on the substrate 210 and the power input structure 240 is inserted into the power input holes 214. The power input structure 240 further has a fastening hole 242 and at least one cable connecting hole 244 positioned adjacent the fastening hole 242. With the provision of the fastening hole 242, two or more power transforming circuit boards 200 that include the power input structure 240 with the fastening hole 242 can be fastened together with a fastener (e.g. screw). The cable connecting holes 244 allow for insertion of power cables 230. In the present embodiment, the power input structure 240 and the power output structure 220 are located on the same surface of the substrate 210. In other embodiments not illustrated, the power input structure 240 and the power output structure 220 may also be located on opposite surfaces of the substrate 210. In addition, it is to be understood that the power input structure 240 may include at least one of the fastening hole 242 and the cable connecting hole 244, depending upon actual requirements.

Figure 4:
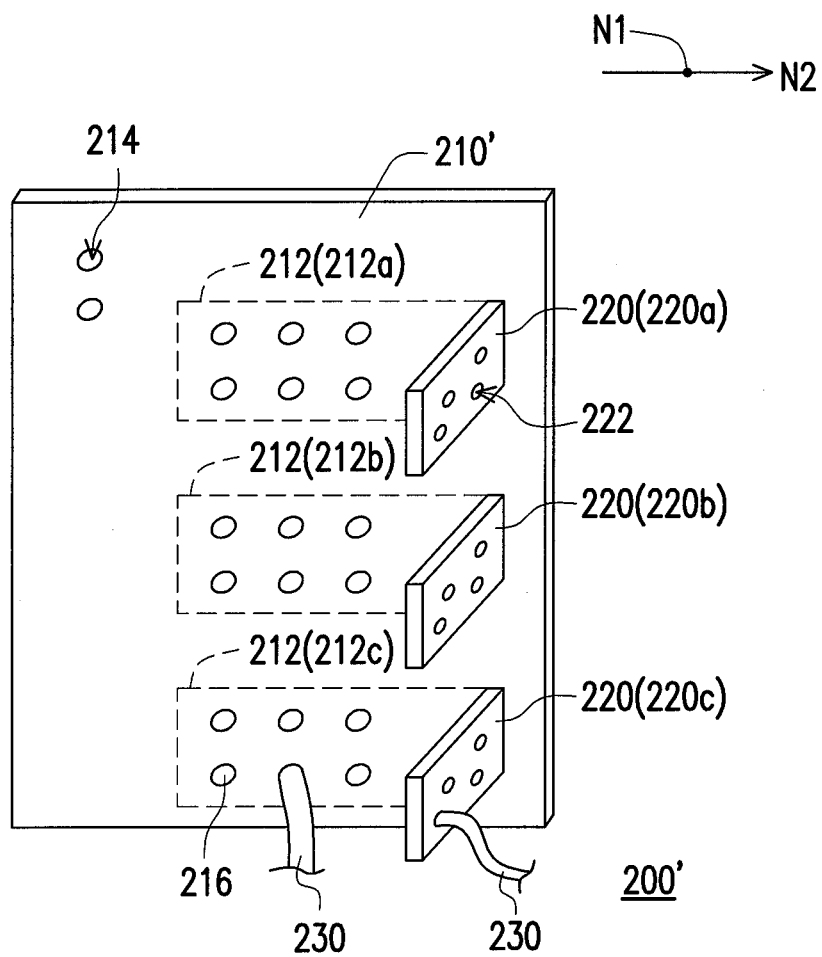
FIG. 4 illustrates a power transforming circuit board according to still another embodiment of the present invention.

FIG. 4 illustrates a power transforming circuit board according to still another embodiment of the present invention. Referring to FIG. 4, the substrate 210' may likewise be provided with at least one cable connecting hole 216. These cable connecting holes 216 may be positioned in areas corresponding to the power transforming circuits 212 and are electrically connected with corresponding power transforming circuits 212. As such, the power cable 230 may be connected to both the cable connecting hole 216 of the substrate 210' and the cable connecting hole 222 of the power output structure 220, thus improving the expandability of the power transforming circuit board 200'.

In summary, the power transforming circuit board of the present invention is obviously different from the conventional circuit boards. The power transforming circuit board of the present invention includes the power output structures disposed on the substrate. The power output structure is provided with cable connecting holes, thereby reducing the area of the substrate and hence effectively reducing the overall size of the electronic devices equipped with the power transforming circuit board. In addition, the power cable can still be connected in the cable connecting hole of the power output structure for power output. Moreover, the power transforming circuit board can further be provided with a power input structure having cable connecting holes, or the substrate can be provided with cable connecting holes, thus improving the expandability of the power transforming circuit board to allow insertion of the cables.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power transforming circuit board comprising:
   a substrate comprising at least one power transforming circuit and at least one pair of power input holes; and
   a plurality of power output structures disposed on the substrate, wherein the power output structures are each respectively and electrically connected with one corresponding power transforming circuit, an amount of the power output structure is equal to an amount of the power transforming circuit, each power output structure has at least one cable connecting hole, and the normal direction of each power output structure is oriented at an angle with respect to the normal direction of the substrate.

2. The power transforming circuit board according to claim 1, wherein the power output structures do not all output the same power.

3. The power transforming circuit board according to claim 1, further comprising at least one power cable inserted into the cable holes of the power output structures, respectively.

4. The power transforming circuit board according to claim 1, further comprising a power input structure disposed on the substrate and inserted into the pair of power input holes.

5. The power transforming circuit board according to claim 4, wherein the power input structure has a fastening hole.

6. The power transforming circuit board according to claim 5, wherein the power input structure further includes at least one cable connecting hole positioned adjacent the fastening hole.

7. The power transforming circuit board according to claim 4, wherein the power input structure and the power output structures are disposed on the same surface of the substrate.

8. The power transforming circuit board according to claim 4, wherein the power input structure and the power output structures are disposed on opposite surfaces of the substrate.

9. The power transforming circuit board according to claim 1, wherein the angle included between the normal direction of each power output structure and the normal direction of the substrate is within the range from 0 to 180 degrees.

\* \* \* \* \*